(12) United States Patent
Watase et al.

(10) Patent No.: US 6,559,528 B2
(45) Date of Patent: May 6, 2003

(54) SEMICONDUCTOR DEVICE AND METHOD FOR THE FABRICATION THEREOF

(75) Inventors: Kazumi Watase, Kyoto (JP); Hiroaki Fujimoto, Hirakata (JP); Ryuichi Sahara, Hirakata (JP); Nozomi Shimoishizaka, Kyoto (JP); Takahiro Kumakawa, Takatsuki (JP); Kazuyuki Kaino, Hirakata (JP); Yoshifumi Nakamura, Neyagawa (JP)

(73) Assignee: Matsushita Electric Industrial Co., Ltd. (JP)

( * ) Notice: Subject to any disclaimer, the term of this patent is extended or adjusted under 35 U.S.C. 154(b) by 45 days.

(21) Appl. No.: 09/785,503

(22) Filed: Feb. 20, 2001

(65) Prior Publication Data

US 2001/0015496 A1 Aug. 23, 2001

(30) Foreign Application Priority Data

Feb. 21, 2000 (JP) ........................ 2000-042130

(51) Int. Cl.[7] ...................... H01L 23/498; H01L 23/538
(52) U.S. Cl. ...................... 257/684; 257/723; 257/724; 257/777
(58) Field of Search ................................ 257/684, 777, 257/723, 724, 787

(56) References Cited

U.S. PATENT DOCUMENTS

| | | | | |
|---|---|---|---|---|
| 5,608,262 A | * | 3/1997 | Degani et al. ............... | 257/723 |
| 5,945,741 A | * | 8/1999 | Ohsawa et al. ............. | 257/777 |
| 5,969,894 A | * | 10/1999 | Howell et al. ................ | 360/46 |
| 6,084,308 A | * | 7/2000 | Kelkar et al. ................ | 257/777 |
| 6,147,401 A | * | 11/2000 | Solberg ....................... | 257/723 |
| 6,204,562 B1 | * | 3/2001 | Ho et al. ..................... | 257/723 |
| 6,225,699 B1 | * | 5/2001 | Ference et al. ............. | 257/737 |
| 6,294,839 B1 | * | 9/2001 | Mess et al. .................. | 257/686 |
| 6,352,879 B1 | * | 3/2002 | Fukui et al. ................. | 438/106 |
| 6,369,443 B1 | * | 4/2002 | Baba .......................... | 257/700 |
| 6,414,385 B1 | * | 7/2002 | Huang et al. ................ | 257/690 |

FOREIGN PATENT DOCUMENTS

| | | |
|---|---|---|
| EP | 0 991 119 A1 | 4/2000 |
| JP | 10-32307 | 2/1998 |
| JP | 11-54649 | 2/1999 |

* cited by examiner

Primary Examiner—George Fourson
(74) Attorney, Agent, or Firm—Nixon Peabody LLP; Donald R. Studebaker

(57) ABSTRACT

Disclosed is a semiconductor device 10 comprising a first semiconductor element 11 with an arrangement of first element electrodes 12, a second semiconductor element 13 with an arrangement of second element electrodes 14, a connection member 15 electrically connecting together a portion 12b of the first element electrodes 12 and the second element electrodes 14, an insulation layer 17 covering a major surface 11a of the first semiconductor element 11 and a backside surface 13b of the second semiconductor element 13, a wiring layer 22 formed on the insulation layer 17 and electrically connected to the first element electrode portion 12b exposed in an opening portion 21, and an external electrode 23 formed, as a portion of the wiring layer 22, on the insulation layer 17.

6 Claims, 5 Drawing Sheets

SEMICONDUCTOR DEVICE AND METHOD FOR THE FABRICATION THEREOF

BACKGROUND OF THE INVENTION

The present invention relates to a semiconductor device provided with semiconductor elements and to a method for the fabrication of such a semiconductor device. The present invention relates more particularly to a semiconductor device protecting its semiconductor elements and securing establishment of electrical connections between the semiconductor elements and external equipment.

In recent years, since electronic equipment is becoming smaller and smaller in size and being highly improved in function, there have been strong demands for improvement in packaging density as well as the miniaturization and the high operation rate of the semiconductor device. In order to meet these demands, various forms of packaging have been developed. For example, the COC (Chip On Chip) module has been developed as a packaging form (Japanese Unexamined Patent Gazette No. H10-32307).

Hereinafter, a semiconductor device of a conventional COC module (hereinafter referred to as the "COC") and a method for the fabrication of such a COC will be described with reference to FIG. 5.

FIG. 5 schematically shows a cross section of the conventional COC 100. The COC 100 includes a first semiconductor chip 101 containing a first semiconductor integrated circuit part and a second semiconductor chip 102 containing a second semiconductor integrated circuit part. These first and second semiconductor chips 101 and 102 are electrically connected together by a face-down technique. Since the face-down technique is used, the major surface of the semiconductor chip 102 faces downward while the backside surface of the semiconductor chip 102 faces upward.

The first semiconductor chip 101 is mounted on a die pad 106a of a lead frame 106, and the second semiconductor chip 102, located above the first semiconductor chip 101, is smaller in chip size than the first semiconductor chip 101. Both the first semiconductor chip 101 and the second semiconductor chip 102 are encapsulated with an encapsulating resin 108.

Formed on the major surface of the first semiconductor chip 101 are a plurality of first element electrodes 103 electrically connected to the first semiconductor integrated circuit part. On the other hand, formed on the major surface of the second semiconductor chip 102 are a plurality of second element electrodes 104 electrically connected to the second semiconductor integrated circuit part. The first semiconductor chip 101 and the second semiconductor chip 102 are placed such that their major surfaces face each other, and a portion 103a of the first element electrodes 103 of the first semiconductor chip 101 and the second element electrodes 104 of the second semiconductor chip 102 are connected together electrically by a connection member (for example, a bump) 105. Further, a portion 103b of the first element electrodes 103 of the first semiconductor chip 101 is electrically connected to an external lead (an external electrode) 106b of the lead frame 106 by a boding wire (for example, a wire of Au).

Referring still to FIG. 5, a method for the fabrication of the conventional COC 100 will be described below.

First, the first semiconductor chip 101 and the second semiconductor chip 102 are prepared. Following this, the connection member 105, made of solder or the like, is formed on each of the second element electrodes 104 of the second semiconductor chip 102. Next, the second semiconductor chip 102 is mounted onto the first semiconductor chip 101 such that each of the second element electrodes 104 of the second semiconductor chip 102 is connected to each of the first element electrode portions 103a of the first semiconductor chip 101 through the connection member 105. Then, the connection member 105 is melted, thereby electrically connecting together the second element electrodes 104 of the second semiconductor chip 102 and the first element electrode portions 103a of the first semiconductor chip 101.

Next, the first semiconductor chip 101 is mounted onto the die pad 106a of the lead frame 106. This is followed by wire bonding of electrically connecting together the first element electrode portion 103b of the first semiconductor chip 101 and the external lead 106b of the lead frame 106 by a bonding wire (for example, a wire of Au). Lastly, the fist semiconductor chip 101, the second semiconductor chip 102, the die pad 106a of the lead frame 106, and a portion of the external lead 106b of the lead frame 106 are all encapsulated by the encapsulating resin 108, and the COC 100 is obtained.

However, the conventional COC 100 has difficulties in being multipin-ized to a further extent. That is, in the COC 100, external connection is established by the external lead 106b extracted from a lateral surface of the encapsulating resin (the package) 108, which makes it difficult to further provide many external electrodes (external terminals). Furthermore, the external dimensions of the COC 100 are constrained by the package dimensions such as the size of the lead frame 106. Therefore, it is difficult to reduce the size of the COC 100.

Bearing in mind the above-described problems, the present invention was made. Accordingly, a major object of the present invention is to provide a semiconductor device capable of coping with multipin-ization and reducible in size and a method for the fabrication of such a semiconductor device.

SUMMARY OF THE INVENTION

The present invention provides, in order to achieve the aforesaid object, a semiconductor device which comprises (a) a first semiconductor element having a major surface on which a plurality of first element electrodes are disposed, (b) a second semiconductor element having a major surface on which a plurality of second element electrodes are disposed, the major surface of the second semiconductor element facing the major surface of the first semiconductor element, (c) a connection member electrically connecting together at least a portion of the plural first element electrodes of the first semiconductor element and at least a portion of the plural second element electrodes of the second semiconductor element, (d) an insulation layer coating the major surface of the first semiconductor element and a backside surface of the second semiconductor element, (e) an opening portion formed in the insulation layer and exposing at least a portion of the plural first element electrodes, (f) a wiring layer formed on the insulation layer and electrically connected to the first element electrode exposed in the opening portion, and (g) a plurality of external electrodes formed, as portions of the wiring layer, on the insulation layer and electrically connectable to external equipment.

In an embodiment of the present invention, the first semiconductor element and the second semiconductor element are a semiconductor chip, respectively, and the area of the major surface of the first semiconductor element is greater than the area of the major surface of the second semiconductor element. Further, in an embodiment of the present invention, the first semiconductor element is a semiconductor chip formed in a semiconductor wafer.

It is preferable that at least a portion of the plural external electrodes is formed on the insulation layer located over the backside surface of the second semiconductor element.

In an embodiment of the present invention, the second semiconductor element has on its backside surface at least one external electrode electrically connectable to external equipment.

The semiconductor device of the present invention may further comprise a passivation film formed on the major surface of the first semiconductor element and having opening portions exposing the plural first element electrodes, wherein the insulation layer is formed on the passivation film.

The semiconductor device of the present invention may further comprise metal balls provided on the external electrodes.

The present invention provides a method for the fabrication of a semiconductor device comprising the steps of (a) preparing a first semiconductor element having a major surface on which a plurality of first element electrodes are disposed and a second semiconductor element having a major surface on which a plurality of second element electrodes are disposed, (b) placing the first and second semiconductor elements such that their major surfaces face each other, and thereafter electrically connecting together at least a portion of the plural first element electrodes of the first semiconductor element and at least a portion of the plural second element electrodes of the second semiconductor element by a connection member, (c) forming an insulation layer coating a backside surface of the second semiconductor element and the major surface of the first semiconductor element, (d) forming in the insulation layer an opening portion exposing at least a portion of the plural first element electrodes, and (e) forming on the insulation layer a wiring layer which is electrically connected to the first element electrode exposed in the opening portion, a portion of the wiring layer functioning as an external electrode electrically connectable to external equipment.

It is preferable for the method of the present invention to comprise a step of grinding the backside surface of the second semiconductor element, wherein the step of grinding is performed after the step of electrically connecting together at least the aforesaid portion of the plural first element electrodes and at least the aforesaid portion of the plural second element electrodes.

It is preferable for the method of the present invention to comprise a step of filling an encapsulating resin between the major surfaces of the first and second semiconductor elements facing each other, wherein the step of filling is performed after the step of electrically connecting together at least the aforesaid portion of the plural first element electrodes and at least the aforesaid portion of the plural second element electrodes.

In an embodiment of the present invention, after the step of forming the opening portions in the insulation layer, a step of grinding both the insulation layer and the backside surface of the second semiconductor element and a step of forming another insulation layer on the ground insulation layer and on the ground backside surface of the second semiconductor element, are carried out.

It is preferable for the fabrication method of the present invention to further comprise a step of providing metal balls on the external electrode.

In an embodiment of the present invention, the step of preparing the first and second semiconductor elements is a step of preparing a semiconductor wafer in which a plurality of the first semiconductor elements are formed and preparing a plurality of the second semiconductor elements corresponding to the plural first semiconductor elements formed in the semiconductor wafer, respectively, and after the step of forming the wiring layer a step of dividing the semiconductor wafer is performed such that the plural first semiconductor elements are separated into individual units.

In an embodiment of the present invention, the step of preparing the first and second semiconductor elements is a step of preparing the first and second semiconductor elements which are semiconductor chips.

In the semiconductor device of the present invention, external electrodes are formed on the insulation layer with which the major surface of the first semiconductor element and the backside surface of the second semiconductor element are coated, whereby a two-dimensional arrangement of external electrodes becomes possible to make. This therefore provides a semiconductor device on which a much greater number of external electrodes can be formed, when compared with the conventional semiconductor device using, as an external electrode, an external lead extracted from a lateral surface of the conventional semiconductor device. Further, the semiconductor device of the present invention differs from the conventional semiconductor device in using no lead frame, and in the semiconductor device of the present invention the external electrodes are formed on the insulation layer located on the major surface of the first semiconductor element, whereby the semiconductor device of the present invention can be of the size of the first semiconductor element. The present invention therefore provides a further down-sized semiconductor device than the conventional semiconductor device which is dimensionally constrained by the size of lead frame or the like. If external electrodes are formed on the insulation layer located on the backside surface of the second semiconductor element, this makes it possible to use the entire top surface of the semiconductor device for the layout of external electrodes.

When external electrodes are formed on the backside surface of the second semiconductor element, this guides heat, generated in the second semiconductor element, directly to external equipment (e.g., a wiring substrate) where the heat is released. Therefore, the heat releasabiltiy of the semiconductor device can be improved.

When a passivation film is formed on the major surface of the first semiconductor element, the first semiconductor integrated circuit part, contained in the first semiconductor element, can be protected by the passivation film. When a metal ball is provided on the external electrode, this makes it possible to electrically connecting together the external electrode and the wiring substrate through the metal ball in a simple and quick process. Additionally, the provision of the metal ball on the external electrode makes it possible to widen the distance between the external electrode and the wiring substrate, thereby relaxing thermal stress caused by the difference in linear expansion coefficient between the semiconductor device and the wiring substrate and applied to a joint between the semiconductor device and the wiring substrate.

In the semiconductor device fabrication method of the present invention, the step of forming on the insulating layer the wiring layer, which is electrically connected to the first element electrode and portions of which function as external electrodes, is carried out. Thus, the first element electrode and the external electrode can be connected together electrically without using a wire bonding technique used in the conventional technology. Therefore, the present invention is able to provide formation of finer wiring in comparison with the prior art technology. Further, wiring collectively formable in a semiconductor wafer can be prepared and the length of wiring can be made shorter in comparison with the conventional technology, thereby enabling fabrication of a semiconductor device exhibiting improved electrical characteristics.

The thickness of the semiconductor device can be reduced by grinding of the backside surface of the second semiconductor element. When using a pre-thinned second semiconductor element, its handling is difficult because of possible chip breakage or the like. On the other hand, such handling difficulty can be reduced by subjecting to the backside surface of the second semiconductor element to grinding.

In the case that encapsulating resin is filled between the major surface of the first semiconductor element and the major surface of the second semiconductor element, the strength of joining together these semiconductor elements is enhanced. Moreover, such encapsulating-resin filling prevents formation of voids between the major surface of the first semiconductor element and the major surface of the second semiconductor element, thereby preventing the semiconductor device from undergoing cracking due to expansion of water vapor collected in a void. Therefore, semiconductor devices, which are advantageous in being subjected to testing on water absorption and reflow resistance, can be fabricated.

In the case that both the insulation layer and the backside surface of the second semiconductor chip are ground and another insulation layer is formed on the ground insulation layer and on the ground backside surface of the second semiconductor chip, the planarity of the insulation layer is secured and the planarity of the external electrode is made good. Preparation of a semiconductor wafer in which a plurality of the first semiconductor elements have been formed makes it possible to carry out each of the fabrication steps in the semiconductor wafer state, therefore considerably reducing manufacturing costs.

DESCRIPTION OF THE PREFERRED EMBODIMENTS

Figure 1A:
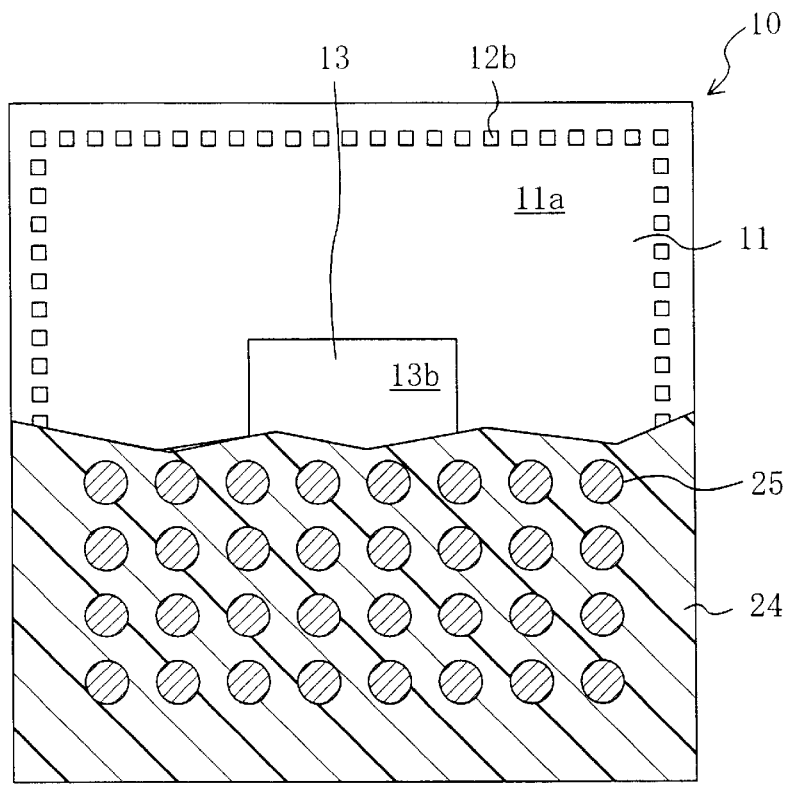
FIG. 1A is a partial cutaway view schematically showing a semiconductor device 10 according to a first embodiment of the present invention and FIG. 1B is a cross-sectional view schematically showing the semiconductor device 10.

Hereinafter, preferred embodiments of the present invention will be described with reference to the accompanying drawings. In the drawings, components having substantially the same function have been assigned the same reference numeral for the purpose of simplifying the description of the present invention. The present invention will not be limited to the following embodiments.

Embodiment 1

Figure 1B:
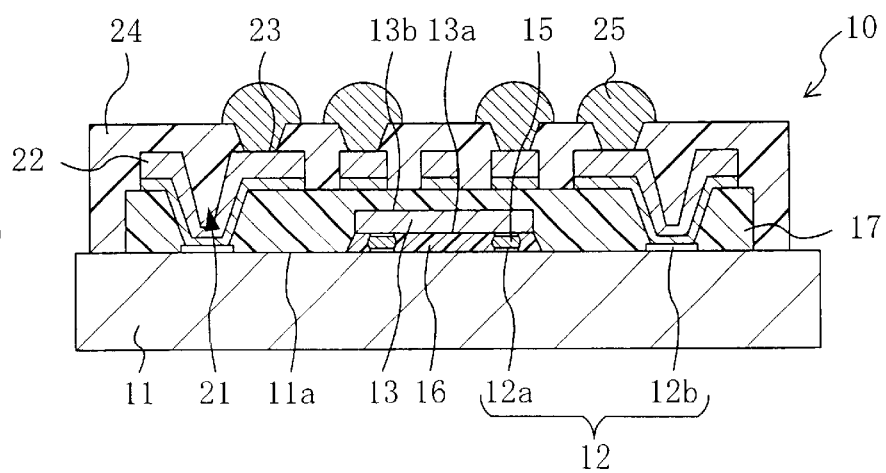

A first embodiment of the present invention will be described with reference to FIG. 1. FIG. 1A is a schematic of the top surface of the semiconductor device 10 according to the present embodiment. A portion of the semiconductor device 10 is cut away to provide an explanation of the internal structure of the semiconductor device 10. FIG. 1B schematically shows a cross section of the semiconductor device 10.

The semiconductor device 10 of the present embodiment includes a first semiconductor element (a first semiconductor chip) 11 having a major surface 11a on which a plurality of first element electrodes 12 are disposed, a second semiconductor element (a second semiconductor chip) 13 having a major surface 13a on which a plurality of second element electrodes 14 are disposed, an insulation layer 17 formed on the major surface 13a of the first semiconductor chip 11 so as to cover the second semiconductor chip 13, and a wiring layer 22 formed on the insulation layer 17. The wiring layer 22 is electrically connected to a portion 12b of the first element electrodes 12, and a land 23, which functions as an external electrode electrically connectable to external equipment (not shown), is formed in a portion of the wiring layer 12. As shown in the figure, a metal ball 25 is provided on the land 23, and it is preferable that a solder resist film 24 be formed on regions of the top surface of the semiconductor device other than where the metal balls 25 are located.

The first semiconductor chip 11 contains therein a first semiconductor integrated circuit part (not shown), and the first element electrode 12 of the first semiconductor chip 11 is electrically connected to the first semiconductor integrated circuit part. On the other hand, the second semiconductor chip 13 contains therein a second semiconductor integrated circuit part (not shown), and the second element electrode 14 of the second semiconductor chip 13 is electrically connected to the second semiconductor integrated circuit part. Preferably, a passivation film (not shown) having an opening portion exposing the first element electrode 12 is formed on the major surface 11a of the first semiconductor chip 11 for giving protection to the first semiconductor integrated circuit.

The first semiconductor chip 11 and the second semiconductor chip 13 are placed such that their major surfaces 11a and 13a face each other, and the major surface 13a of the second semiconductor chip 13 faces downward while on the other hand a backside surface 13b of the second semiconductor chip 13 faces upward. The second element electrodes 14 of the second semiconductor chip 13 are electrically connected, through a connection member 15, to a portion 12a of the first element electrodes 12 of the first semiconductor chip 11.

In the present embodiment, the first element electrode portions 12a electrically connected to the second element electrodes 14 of the second semiconductor chip 13 are placed at the middle of the major surface 11a of the semiconductor chip 11. The first element electrodes 12 other than the first element electrode portions 12a, i.e., the first element electrode portions 12b, are placed at the outer periphery of the major surface 11a of the first semiconductor chip 11. The size of the second semiconductor chip 13 is smaller than that of the first semiconductor chip 11. In other words, the area of the major surface 13a of the second semiconductor chip 13 is smaller than the area of the major surface 11a of the first semiconductor chip 11. In the present embodiment, for the purpose of reducing the thickness of the semiconductor device 10, a semiconductor chip which is thinner than typical semiconductor chips is used as the second semiconductor chip 13.

In the present embodiment, the first semiconductor element is a semiconductor chip. However, a semiconductor wafer prior to undergoing division into individual semiconductor chips may be used. That is to say, the first semiconductor chip 11 may be in the state of being formed in a semiconductor wafer. Further, the first element electrode portions 12b of the first semiconductor chip 11 are not necessarily provided around all the sides of the outer periphery of the major surface 11a of the first semiconductor chip 11.

The connection member 15, which provides electrical connection between the first element electrode portion 12a of the first semiconductor chip 11 and the second element electrode 14 of the second semiconductor chip 13, is made of, for example, solder or conductive paste. The height of the connection member 15 is about from 5 to 150 µm and the width (or the diameter) is about from 5 to 150 µm.

In the present embodiment, the encapsulating resin 16 is filled in a space between the major surface 11a of the first semiconductor chip 11 and the major surface 13a of the second semiconductor chip 13. Such filling by the encapsulating resin 16 provides improved reliability of connection of the first semiconductor chip 11 with the second semiconductor chip 13. As the encapsulating resin 16, epoxy resin can be used. Alternatively, the insulation layer 17 may be applied between the major surface 11a of the first semiconductor chip 11 and the major surface 13a of the second semiconductor chip 13, without filling the encapsulating resin 16.

In the case that the encapsulating resin 16 is filled, in addition to the advantage of improving the aforesaid connection reliability between the first semiconductor chip 11 and the second semiconductor chip 13, there is produced another advantage that the gap between the major surface 11a of the semiconductor chip 11 and the major surface 13a of the semiconductor chip 13 is made free of voids. Such a measure against the creation of voids makes it possible to prevent the semiconductor device from undergoing cracking due to expansion of water vapor collected in a void. Therefore, semiconductor devices, which are advantageous in being subjected to testing on water absorption and reflow resistance, can be fabricated.

The insulation layer 17 is formed on the major surface 11a of the first semiconductor chip 11 and on a backside surface 13b of the second semiconductor chip 13. Formed in the insulation layer 17 is an opening portion 21 exposing the first element electrode portion 12b of the first semiconductor chip 11. In order to prevent disconnection of the wiring layer 22, it is preferable to form the opening portion 21 of the insulation layer 17 in such a way that each of lateral surfaces defining the opening portion 21 and the top surface of the insulation layer 17 form an obtuse angle (for example, from about 100 to about 140 degrees).

The insulation layer 17 is made of material having insulative properties such as polymeric material (ester bonding type polyimide and acrylic epoxy). The insulation layer 17 is so thick as to cover the second semiconductor chip 13. Preferably, the thickness of the insulation layer 17 is from about 50 to about 800 µm on the basis of the major surface 11a of the first semiconductor chip 11, more preferably, about 400 µm from the viewpoint of stress absorption and semiconductor device packaging height.

It is preferable that the insulation layer 17 is made of elastic material having insulative properties, the reasons for which is as follows. If the insulation layer 17 is made of a material whose modulus of elasticity is low (for example, 2000 kg/mm$^2$ or below), thermal stress, caused by the difference in thermal expansion coefficient between the wiring substrate on which the semiconductor device 10 is mounted and the first semiconductor chip 11, can be prevented and controlled effectively by the insulation layer 17. Polymeric material, such as ester bonding type polyimide and acrylic epoxy, can be used as the low elasticity modulus material.

Formed on the insulation layer 17 is the wiring layer 22 as a wiring pattern electrically connected to the first element electrode portion 12b exposed in the opening portion 21. The wiring layer 22 is made of copper, et cetera. Formed in a portion of the wiring layer 22 is the land 23 electrically connectable to external equipment (not shown). Since the land 23 is formed, in two dimensions, on the insulation layer 17 located over the major surface 11a of the semiconductor chip 11, this allows the semiconductor device 10 of the present embodiment to cope with multipin-ization in comparison with the conventional COC 100. Moreover, it is possible to form the lands 23 also on the insulation layer 17 located on the backside surface 13b of the second semiconductor chip 13, therefore making it possible to form a great number of the lands 23 all over the top surface of the semiconductor device 10. Further, in the semiconductor device 10 of the present embodiment, the land 23 functioning as an external electrode and the first element electrode portion 12b are connected together electrically by the wiring layer 22 capable of fine wiring. Therefore, when compared with the COC 100 in which a wire bonding technique is used to electrically connecting together the element electrode 103b and the external electrode (external lead) 106b by the bonding wire 107, the size of the semiconductor device can be reduced to a further extent.

It is preferable that the metal ball 25 functioning as an external electrode terminal is joined to the land 23. The metal ball 25 is made of, for example, solder, solder-plated copper, or nickel. The metal ball 25 is jointed to the land 23, which makes it possible to electrically connect the land 23 and the wiring substrate through the metal ball 25 in an easy and quick process. Moreover, since the distance between the land 23 and the wiring substrate can be broadened by the metal ball 25, this makes it possible to relax stress caused by the difference in linear expansion coefficient between the semiconductor device 10 and the wiring substrate and applied to a junction between the semiconductor device 10 and the wiring substrate.

It is preferable that the solder resist film 24 is formed in a region of the surface of the insulation layer 17 other than where the metal balls 25 are located, to cover the wiring layer 22. That is to say, it is preferable to form the solder resist film 24 so as to cover the wiring layer 22 and expose a portion of the metal ball 25. The solder resist film 24 prevents unwanted electrical short of the wiring layer 22 caused by the solder of the metal ball 25. Furthermore, unwanted electrical contact of the wiring layer 22 with the wiring substrate can be prevented.

In accordance with the present embodiment, it is possible to form, in two dimensions, a plurality of the lands 23 functioning as external electrodes on the insulation layer 17. As a result, a great number of the lands 23 can be formed all over the top surface of the semiconductor device 10, therefore making it possible to cope with multipin-ization. Moreover, the land 23 formed over the major surface 11a of the first semiconductor chip 11 is made to function as an external electrode, therefore eliminating the need for using a lead frame (an external lead). Thus, it is possible to make the size of the semiconductor device 10 become the size of the first semiconductor chip 11, as a result of which the size of the semiconductor device can be made smaller in comparison with the COC 100 that employs a lead frame. Further, since the element electrode 12 and the external electrode 23 are connected together electrically by the wiring layer 22 without using a wire bonding technique employed in the COC 100, this makes it possible to provide formation of finer wiring when compared with the COC 100. Furthermore, since the length of wiring can be made shorter in comparison with the COC 100, this improves the electrical characteristics of the semiconductor device.

Figure 2A:
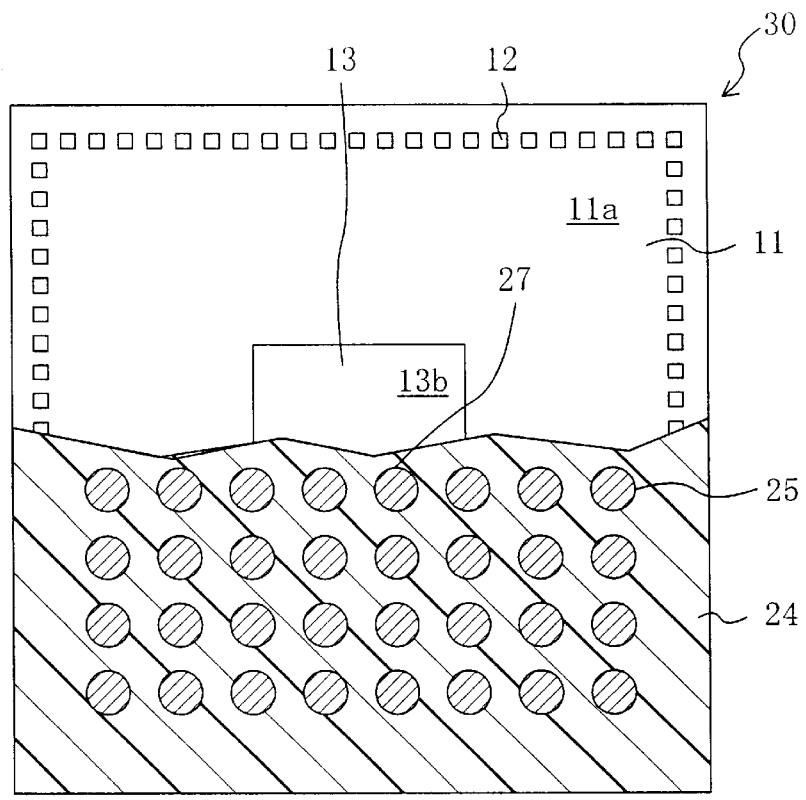
FIG. 2A is a partial cutaway view schematically showing a semiconductor device 30 according to the first embodiment and FIG. 2B is a cross-sectional view schematically showing the semiconductor device 30.
Figure 2B:
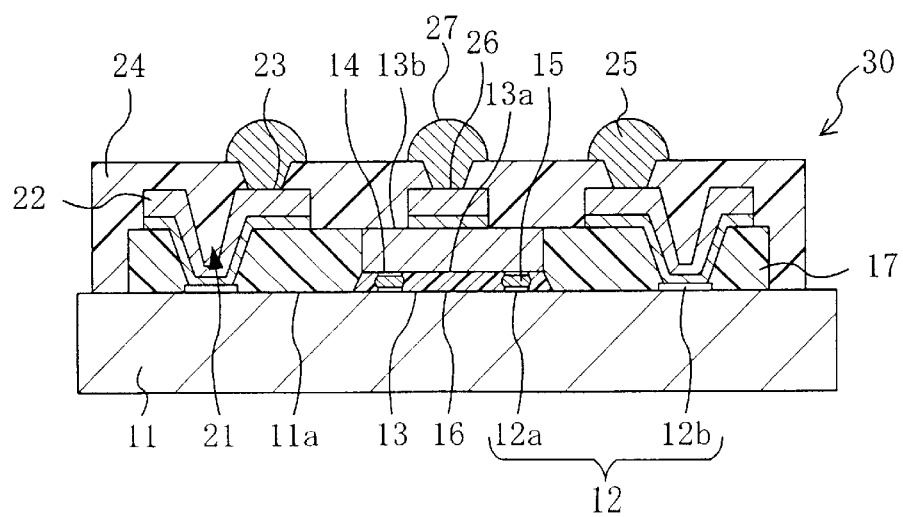

Additionally, as shown in FIGS. 2A and 2B, it is possible to provide a semiconductor device 30 having a structure in which a land (external electrode) 26 electrically connectable to external equipment is formed on the backside surface 13b of the second semiconductor chip 13 exposed from the insulation layer 17. In the example of FIG. 2, a metal ball 27 is further formed on the land 26. Because of such arrangement that the land 26 is formed on the backside surface 26 of the second semiconductor chip 13, heat generated in the second semiconductor chip 13 travels to the land 26, therefore providing a structure capable of direct heat release to external equipment (for example, a wiring substrate). As a result, the heat releasabiltiy of the semiconductor device can be improved. In the example of FIG. 2, the second semiconductor chip 13 has a common thickness. However, the second semiconductor chip 13, which is thinner than usual, may be used.

Embodiment 2

Hereinafter, a method for the fabrication of a semiconductor device according to a second embodiment of the present invention will be described with reference to FIGS. 3A–3G and FIGS. 4A–4G. FIGS. 3A–3G and FIGS. 4A–4G illustrate in cross section respective steps of the semiconductor device fabrication method of the present embodiment.

Figure 3A:
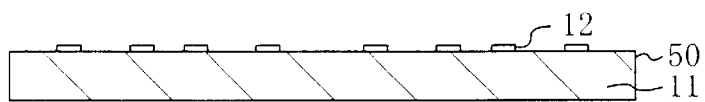
FIGS. 3A–3G cross-sectionally show respective steps of a method for the fabrication of a semiconductor device according to a second embodiment of the present invention.

First, as shown in FIG. 3A, a semiconductor wafer 50 is prepared. The semiconductor wafer 50 includes a plurality of the first semiconductor chips 11 on which the first element electrodes 12 are formed. Not the semiconductor wafer 50 but the first semiconductor chip 11 in the chip state may be prepared.

Figure 3B:
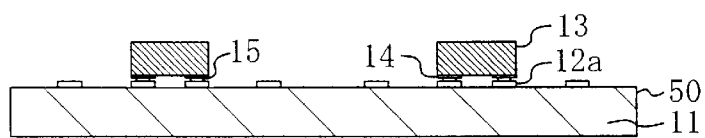

Next, as shown in FIG. 3B, the connection member 15, made of, for example, solder or conductive paste, is formed on the second element electrode 14 of the second semiconductor chip 13. Thereafter, the second element electrode 14 of the second semiconductor chip 13 is placed, through the connection member 15, onto the first element electrode portion 12a of the first semiconductor chip 11 and these electrodes are jointed together.

Figure 3C:
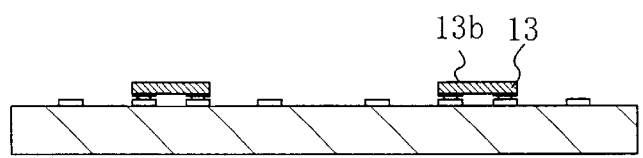

Next, as shown in FIG. 3C, the backside surface 13b of the second semiconductor chip 13 is ground flat. For example, this plane grinding is carried out with a back grinder usually used in the semiconductor fabrication process, so as to reduce the thickness of a semiconductor device to be fabricated. When the backside surface 13b of the second semiconductor chip 13 is ground in the way described above, this contributes to reducing handling difficulty. On the other hand, the pre-thinned second semiconductor element is difficult to handle because it is likely to break.

Figure 3D:

Next, as shown in FIG. 3D, the encapsulating resin 16 is filled in a gap between the first semiconductor chip 11 and the second semiconductor chip 13. The encapsulating resin 16 is filled to enhance the strength of joining together these semiconductor chips 11 and 13. For example, like the conventional FC packaging step, the encapsulating resin 16 is filled by dispenser application. As the encapsulating resin, epoxy resin can be used. In order to improve the reliability, it is preferable to enhance the strength of joining together the first semiconductor chip 11 and the second semiconductor chip 13 before subjecting the backside surface 13b of the second semiconductor chip 13 to grinding. Therefore, there can be made switching between the step of FIG. 3C and the step of FIG. 3D in the order in which they are carried out.

It is possible to advance to the next step (FIG. 3E) without performing the filling step by the encapsulating resin 16. However, the filling of the encapsulating resin 16 is able to avoid the possibility that voids are left between the major surface 11a of the first semiconductor chip 11 and the major surface 13a of the second semiconductor chip 13. This prevents the semiconductor device from undergoing cracking caused by expansion of water vapor collected in a void, being advantageous in being subjected to testing on water absorption and reflow resistance.

Figure 3E:
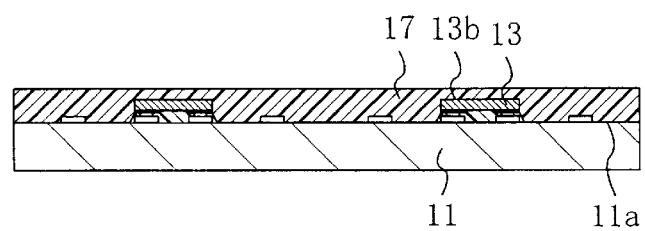

Next, as shown in FIG. 3E, the insulation layer 17 is so formed as to coat the backside surface 13b of the second semiconductor chip 13 and the major surface 11a of the first semiconductor chip 11. The insulation layer 17 is formed as follows. A photosensitive insulating material is applied by a spin coat technique to such an extent that the backside surface 13b of the second semiconductor chip 13 is coated with the photosensitive insulating material. Thereafter, the photosensitive insulating material is dried. The thickness of the insulation layer 17 is preferably from about 50 to about 800 $\mu$m, more preferably about 400 $\mu$m.

When forming the insulation layer 17 coating the backside surface 13b of the second semiconductor chip 13 and the major surface 11a of the first semiconductor chip 11, there is the possibility that stepped portions are created in the insulation layer 17 depending on the thickness and dimensions of the second semiconductor chip 13. In this case, after forming the insulation layer 17 or after performing the next step (the step of FIG. 3F), the following step may be carried out. Both the backside surface 13b of the second semiconductor chip 13 and the insulation layer 17 are ground, and then a further insulation layer is formed on the ground insulation layer 17 and on the ground backside surface 13b of the second semiconductor chip 13. This secures the planarity of the insulation layer 17, therefore making the planarity of external electrodes formed on the insulation layer 17 good. It is possible to perform grinding at only this stage without performing any grinding in the step of FIG. 3C.

Figure 3F:
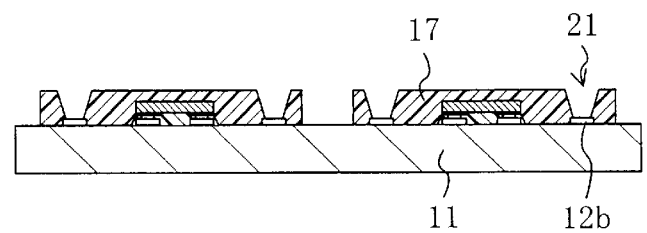

Next, as shown in FIG. 3F, the dried insulation layer 17 is sequentially exposed to light and developed, whereby the insulation layer 17 located on the first element electrode portions 12b of the first semiconductor chip 11 is selectively removed. By this, the opening portions 21 exposing the first element electrode portions 12b of the first semiconductor chip 11 are formed in the insulation layer 17. When forming the opening portion 21, it is preferable that not parallel light but diffused light (including scattered light) be used in the exposure step. The use of scattered light makes it possible to form the opening portion 21 such that the lateral surface of the opening portion 21 and the top surface of the insulation layer 17 form an obtuse angle (for example, from about 100 to about 140 degrees).

As the photosensitive insulating material used to form the insulation layer 17, polymeric material, such as ester bonding type polyimide and acrylic epoxy, can be used. The insulation layer 17 is not limited to a particular material (any material may be used as long as it has insulating properties). As the insulating layer 17 having photosensitive properties, a material pre-formed in the form of a film may be used. In this case, it is possible to form, after the film-like insulation layer 17 is affixed onto the major surface 11a of the first semiconductor chip 11, the opening portions 21 in the insulation layer 17 by sequentially carrying out exposure and development steps. Furthermore, it is possible to form the opening portions 21 by mechanical processing making use of laser or plasma, or by chemical processing such as etching after the formation of the non-photosensitive insulation layer 17.

Figure 3G:
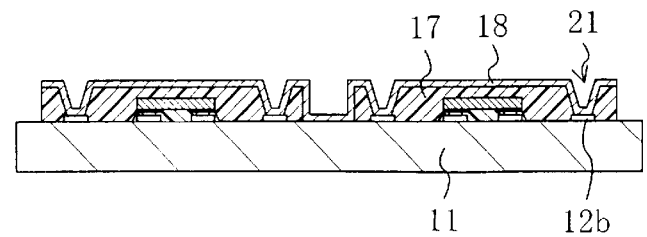

Next, as shown in FIG. 3G, a thin metal layer 18 is formed on the insulation layer 17 and on the first element electrode portion 12b of the first semiconductor chip 11 exposed in the opening portion 21. The thin metal layer 18 can be formed by thin film formation technologies such as sputtering, vacuum evaporation, CVD, and electroless plating. In the present embodiment, the thin metal layer 18 is made up of a film of Ti having a thickness of about 0.2 $\mu$m and a film of Cu formed on the Ti film and having a thickness of about 0.5 $\mu$m.

Figure 4A:
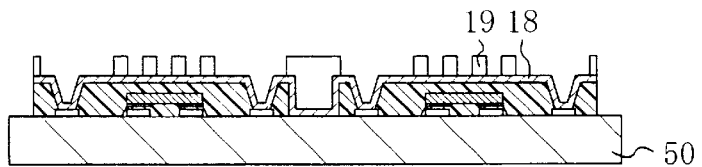
FIGS. 4A–4G cross-sectionally show respective steps of the semiconductor device fabrication method of the second embodiment.

Next, as shown in FIG. 4A, either a positive photosensitive resist film or a negative photosensitive resist film is formed on the thin metal layer 18 by a spin coat technique. Thereafter, other than desired patterns for the finished product is hardened by exposure and development technology known in the art, to prepare a plating resist film 19.

Figure 4B:
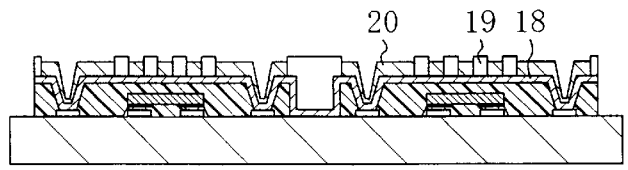

Next, as shown in FIG. 4B, a thick metal layer 20 is selectively formed, by thick film formation technologies such as electro-plating, on regions of the thin metal layer 18 other than where the plating resist film 19 has been formed. In the present embodiment, the thick metal layer 20 is made of a film of Cu (thickness: 10 $\mu$m).

Figure 4C:
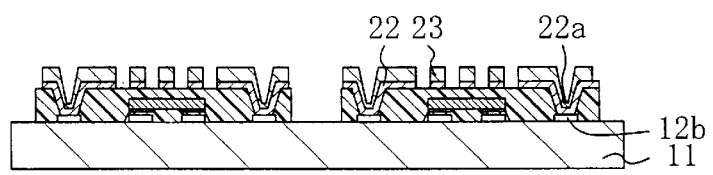

Next, as shown in FIG. 4C, after the formation of the thick metal layer 20, the plating resist film 19 is decomposed and removed. Following this, the thin film metal layer 18 and the thick film metal layer 20 are selectively removed to form the metal wiring layer 22 as a metal wiring pattern including the land 23 and a contact portion 22a contacting the first element electrode portion 12b. The metal wiring layer 22 is formed by application of an etching liquid capable of dissolution and removal of the thin metal layer 18. For instance, when entire surface etching is carried out by using a solution of cupric chloride for the Cu film and a solution of EDTA for the Ti film, the thin metal layer 18, which is thinner than the thick metal layer 20, is removed preceding the thick metal layer 20, to form the metal wiring layer 22. An arrangement may be made in which after the plating resist film 19 is removed an etching resist film having a desirable pattern form is formed by a photolithography technique so that the thick metal layer 20 is protected by the etching resist film.

Figure 4D:
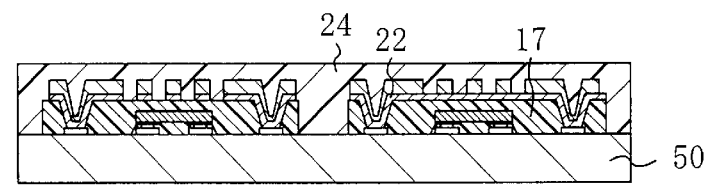
Figure 4E:
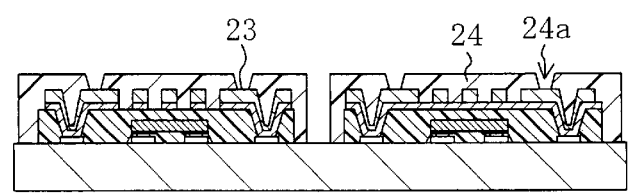

Next, as shown in FIG. 4D, the photosensitive solder resist film 24 is formed, by a spin coat technique, on the metal wiring layer 22 and the insulation film 17. Thereafter, as shown in FIG. 4E, an opening portion 24a exposing the land 23 is formed in the solder resist film 24 by a photolithography technique known in the art. The formation of the solder resist film 24 makes it possible to protect portions of the metal wiring layer 22 other than the lands 23 from melted metal balls (solder).

Figure 4F:
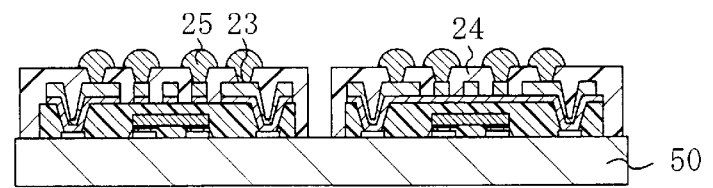
Figure 4G:
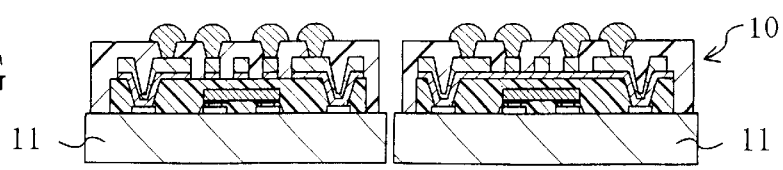
Figure 5:
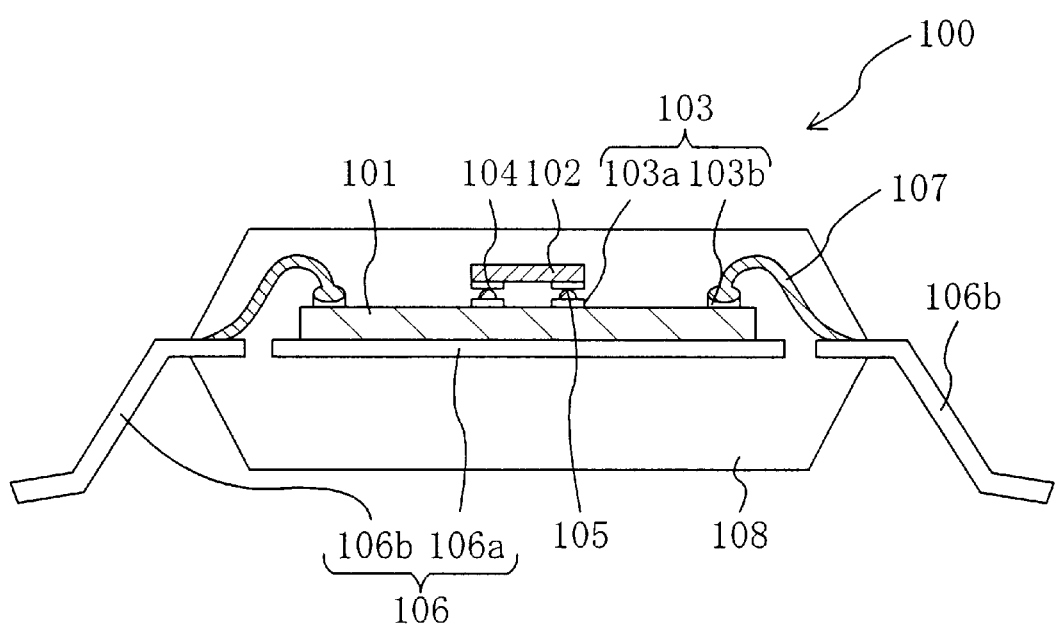
FIG. 5 is a cross-sectional view schematically showing a semiconductor device 100 as known in the prior art.

Next, as shown in FIG. 4F, the metal ball 25 is placed on the land 23, following which the metal ball 25 and the land 23 are jointed together by melting. Finally, as shown in FIG. 4G, the semiconductor wafer 50 is divided by a dicing saw to obtain the semiconductor devices 10.

In the present embodiment, without employing any wire bonding technique used in the prior art, the metal wiring layer (metal wiring pattern) 22 is formed thereby to electrically connect together the first element electrode 12 and the land 23. Accordingly, when compared with the conventional COC 100, it is possible to form finer wiring as well as to make the length of wiring shorter. Furthermore, in the present embodiment, each fabrication step is carried out in the semiconductor wafer state, therefore making it possible to considerably reduce manufacturing costs in comparison with the fabrication method of the COC 100.

Other Embodiments

In the foregoing embodiments, as the material for forming the thin metal layer 18 and the thick metal layer 20, Cu is used. However, instead of Cu, for example, Cr, W, Ti/Cu, or Ni may be used. Further, an arrangement may be made in which the thin metal layer 18 and the thick metal layer 20 are made of different materials and in the final etching step an etchant, by which only the thin metal layer 18 is selectively etched, is used.

In the foregoing embodiments, the metal ball 25 is provided. However, instead of the metal ball 25, a projected electrode may be provided. As the projected electrode, either a solder bump formed by printing and melting of solder cream on the land 23, a solder bump formed by dipping in melted solder, or a nickel/gold bump formed by electro-less plating may be provided. Any type of projected electrode is adequate as long as it has conductive properties and projects from the solder resist film 24. The provision of projected electrodes eliminates the need for sequential placement of the metal balls 25 which is a time-consuming step, thereby providing low-cost semiconductor devices.

Additionally, the land grid array (LGA) configuration, in which the land 23 functions as an external electrode terminal, may be employed. When mounting on a wiring substrate a semiconductor device employing an LGA configuration, solder cream is applied onto connection terminals of the wiring substrate. Thereafter, the land 23 and the wiring substrate can be easily brought into electrical connection with each other by, for example, reflowing.

According to the present invention, it is possible to provide a semiconductor device capable of coping with multipin-ization and reducible in dimensions, in comparison with the prior art techniques, for a plurality of external electrodes are formed on the insulation layer with which both the major surface of the first semiconductor element and the backside surface of the second semiconductor element are coated. Furthermore, with the semiconductor device fabrication method of the present invention, the wiring layer, which is electrically connected to the first element electrode and a portion of the wiring layer functions as an external electrode, is formed. Therefore, in comparison with a prior art technique using the wiring bonding technique, the present invention method provides formation of finer wiring.

What is claimed is:

1. A semiconductor device comprising:
  a first semiconductor element having a major surface on which a plurality of first element electrodes are disposed;
  a second semiconductor element having a major surface on which a plurality of second element electrodes are disposed, said major surface of said second semiconductor element facing said major surface of said first semiconductor element;
  a connection member electrically connecting together at least a portion of said plural first element electrodes of said first semiconductor element and at least a portion of said plural second element electrodes of said second semiconductor element;

an insulation layer coating said major surface of said first semiconductor element and a backside surface of said second semiconductor element;

an opening portion formed in said insulation layer exposing at least a portion of said plural first element electrodes;

a wiring layer formed on said insulation layer and electrically connected to said first element electrode exposed in said opening portion; and a plurality of external electrodes formed, as portions of said wiring layer, on said insulation layer and electrically connectable to external equipment and wherein at least a portion of said plural external electrodes is formed on said insulation layer located over said backside surface of said second semiconductor element.

2. The semiconductor device of claim 1, wherein said first semiconductor element and said second semiconductor element are a semiconductor chip, respectively, and wherein the area of said major surface of said first semiconductor element is greater than the area of said major surface of said second semiconductor element.

3. The semiconductor device of claim 2, wherein said first semiconductor element is a semiconductor chip formed in a semiconductor wafer.

4. The semiconductor device of claim 1, wherein said second semiconductor element has on its said backside surface at least one external electrode electrically connectable to external equipment.

5. The semiconductor device of claim 1 further comprising a passivation film formed on said major surface of said first semiconductor element and having opening portions exposing said plural first element electrodes, wherein said insulation layer is formed on said passivation film.

6. The semiconductor device of claim 1 further comprising metal balls provided on said external electrodes.

* * * * *